(12) United States Patent
Shinagawa et al.

(10) Patent No.: US 10,720,374 B2
(45) Date of Patent: Jul. 21, 2020

(54) SEMICONDUCTOR SUBSTRATE

(71) Applicant: Mitsubishi Electric Corporation, Chiyoda-ku (JP)

(72) Inventors: Tomohiro Shinagawa, Tokyo (JP); Takeo Furuhata, Tokyo (JP); Shingo Tomohisa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/774,358

(22) PCT Filed: Feb. 3, 2017

(86) PCT No.: PCT/JP2017/003930
§ 371 (c)(1),
(2) Date: May 8, 2018

(87) PCT Pub. No.: WO2017/135401
PCT Pub. Date: Aug. 10, 2017

(65) Prior Publication Data
US 2019/0252288 A1 Aug. 15, 2019

(30) Foreign Application Priority Data
Feb. 4, 2016 (JP) .................................. 2016-019428

(51) Int. Cl.
*H01L 29/15* (2006.01)
*H01L 31/0312* (2006.01)
(Continued)

(52) U.S. Cl.
CPC ...... *H01L 23/3732* (2013.01); *C23C 14/0605* (2013.01); *C23C 16/0254* (2013.01);
(Continued)

(58) Field of Classification Search
None
See application file for complete search history.

(56) References Cited

U.S. PATENT DOCUMENTS

2006/0266280 A1* 11/2006 Francis ............ H01L 21/02381
117/68
2008/0296586 A1* 12/2008 Francis .................... G01T 1/24
257/77
(Continued)

FOREIGN PATENT DOCUMENTS

| JP | 2012-041252 A | 3/2012 |
| JP | 2015-517205 A | 6/2015 |
| WO | WO 2013/142156 A1 | 9/2013 |

OTHER PUBLICATIONS

Imura, M. et al., "*Growth mechanism of c-axis-oriented AlN on (111) diamond substrates by metal-organic vapor phase epitaxy*", Journal of Crystal Growth 312, 2010, pp. 1325-1328.
(Continued)

Primary Examiner — Calvin Y Choi
(74) Attorney, Agent, or Firm — Xsensus LLP

(57) ABSTRACT

A semiconductor substrate according to the present invention includes a nitride semiconductor layer 203, an amorphous semiconductor layer 205 formed on one main surface side of the nitride semiconductor layer 203, a high-roughness layer 206 which is a semiconductor layer formed on the amorphous semiconductor layer 205 and has a surface roughness larger than the amorphous semiconductor layer 205, and a diamond layer 207 formed on the high-roughness layer 206. Damage to the nitride semiconductor layer can be reduced in forming the diamond layer on the nitride semiconductor layer and adhesion between the layers can be increased.

16 Claims, 3 Drawing Sheets

(51) Int. Cl.

| | | |
|---|---|---|
| *H01L 23/373* | (2006.01) | |
| *C23C 16/27* | (2006.01) | |
| *C30B 25/18* | (2006.01) | |
| *C23C 16/24* | (2006.01) | |
| *H01L 21/02* | (2006.01) | |
| *C30B 29/68* | (2006.01) | |
| *C30B 29/40* | (2006.01) | |
| *C23C 16/02* | (2006.01) | |
| *C23C 16/50* | (2006.01) | |
| *C23C 14/06* | (2006.01) | |
| *H01L 29/16* | (2006.01) | |
| *H01L 21/48* | (2006.01) | |

(52) U.S. Cl.
CPC .......... *C23C 16/0272* (2013.01); *C23C 16/24* (2013.01); *C23C 16/27* (2013.01); *C23C 16/271* (2013.01); *C23C 16/274* (2013.01); *C23C 16/50* (2013.01); *C30B 25/183* (2013.01); *C30B 29/403* (2013.01); *C30B 29/406* (2013.01); *C30B 29/68* (2013.01); *H01L 21/0243* (2013.01); *H01L 21/0245* (2013.01); *H01L 21/0262* (2013.01); *H01L 21/02444* (2013.01); *H01L 21/02458* (2013.01); *H01L 21/02488* (2013.01); *H01L 21/02494* (2013.01); *H01L 21/02502* (2013.01); *H01L 21/02513* (2013.01); *H01L 21/02527* (2013.01); *H01L 21/02595* (2013.01); *H01L 21/481* (2013.01); *H01L 29/1608* (2013.01)

(56) References Cited

U.S. PATENT DOCUMENTS

| | | | |
|---|---|---|---|
| 2013/0248879 | A1 | 9/2013 | Gambin et al. |
| 2015/0222087 | A1* | 8/2015 | Williams .............. C23C 16/274 428/64.1 |

OTHER PUBLICATIONS

International Search Report dated Apr. 25, 2017 in PCT/JP2017/003930, filed on Feb. 3, 2017.
Office Action as received in the corresponding Application No. GB1806771.0 dated Feb. 14, 2020.
Office Action dated Apr. 29, 2020 in United Kingdom Patent Application No. GB1806771.0, 3 pages.

\* cited by examiner

SEMICONDUCTOR SUBSTRATE

TECHNICAL FIELD

The present invention relates to a semiconductor substrate including a nitride semiconductor layer and a diamond layer.

BACKGROUND ART

Group-III nitride semiconductors including gallium nitride (GaN), aluminum nitride (AlN), or aluminum gallium nitride (AlGaN), for example, have large dielectric breakdown field and carrier velocity, thus application thereof to high-power electronic devices or optical devices is expected. However, there is a problem that output characteristics are limited by self-generated heat in a high-power operation.

Accordingly, an attempt to solve the problem described above has been made by forming a nitride semiconductor layer on diamond to manufacture a field effect transistor (FET). Since diamond has extremely high heat conductivity, a field-effect transistor provided on diamond is capable of a high-power operation in principle which cannot be achieved on the other substrate in principle.

However, it is hard to grow a single-crystalline nitride semiconductor layer directly on diamond in a conventional technique (Non-Patent Document 1). A crack occurs even in a polycrystalline nitride semiconductor layer when a film thickness thereof is large, that is equal to or larger than 1000 nm. Since the polycrystalline nitride layer with the crack has extremely low electrical conductivity, a drain current of the field effect transistor manufactured by growing the nitride semiconductor layer directly on diamond is low, so that high output power density cannot be obtained.

Accordingly, in Patent Document 1, a thin film made of Si is laminated on a diamond layer to make a relaxation layer, and a nitride semiconductor layer is formed on the relaxation layer, thereby reducing an occurrence of crack.

Patent Document 2 discloses that diamond is grown on a nitride semiconductor substrate. The nitride semiconductor substrate includes a plurality of epitaxial layers (single-crystalline nitride layer) on an upper surface side and includes a device layer on the epitaxial layers. Diamond is formed in a hole formed on a bottom surface side. In this case, diamond is grown on the nitride, thus diamond microparticles (seeds) are previously dispersed on the nitride.

PRIOR ART DOCUMENTS

Patent Documents

Patent Document 1: Japanese Patent Application Laid-Open No. 2012-41252
Patent Document 2: Japanese Translation of PCT International Application Publication No. 2015-517205

Non-Patent Documents

Non-Patent Document 1: Masataka Imura, et al., "Growth mechanism of c-axis-oriented AlN on (111) diamond substrates by metal-organic vapor phase epitaxy", Journal of Crystal Growth 312 (2010) 1325-1328.

SUMMARY

Problem to be Solved by the Invention

In Patent Document 1, the relaxation layer is provided between the nitride semiconductor layer and the diamond layer, thereby reducing the crack occurring in the nitride semiconductor layer. However, the effect of the relaxation layer decreases with increase in the thickness of the nitride semiconductor layer, and a possibility of the occurrence of crack increases. Accordingly, it is preferable to form the diamond layer on the nitride semiconductor layer as is the case with Patent Document 2.

However, in Patent Document 2, diamond is formed directly on the nitride semiconductor layer, so that there is a problem that the seed crystal of diamond scratches the nitride semiconductor layer. There is also a problem that a binding of the nitride semiconductor layer to the diamond layer is weak, so that adhesion cannot be maintained.

The present invention therefore has been made to solve these problems, and it is an object of the present invention to reduce damage to a nitride semiconductor layer in forming a diamond layer on the nitride semiconductor layer and increase adhesion between these layers.

Means to Solve the Problem

A semiconductor substrate according to the present invention includes a nitride semiconductor layer, an amorphous semiconductor layer formed on one main surface side of the nitride semiconductor layer, a high-roughness layer which is a semiconductor layer formed on the amorphous semiconductor layer and has a surface roughness larger than the amorphous semiconductor layer, and a diamond layer formed on the high-roughness layer.

Effects of the Invention

A semiconductor substrate according to the present invention includes a nitride semiconductor layer, an amorphous semiconductor layer formed on one main surface side of the nitride semiconductor layer, a high-roughness layer which is a semiconductor layer formed on the amorphous semiconductor layer and has a surface roughness larger than the amorphous semiconductor layer, and a diamond layer formed on the high-roughness layer. Accordingly, high adhesion to the diamond layer can be obtained by the high-roughness layer, and damage to the nitride semiconductor layer is reduced by the amorphous semiconductor layer in forming the high-roughness layer and the diamond layer. These and other objects, features, aspects and advantages of the present invention will become more apparent from the following detailed description of the present invention when taken in conjunction with the accompanying drawings.

DESCRIPTION OF EMBODIMENT(S)

Figure 1:
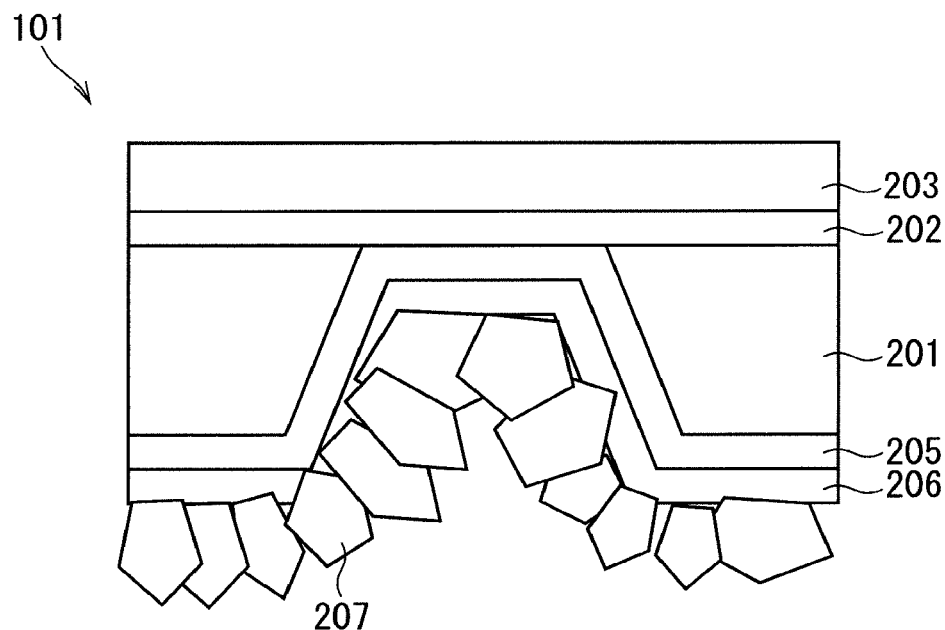
FIG. 1 A cross-sectional view of a semiconductor substrate according to an embodiment 1.

A size of each component and a ratio between the components illustrated in the drawings used in the present specification may be different from the actual ones for easy understanding.

A. Embodiment 1

<A-1. Configuration>

FIG. 1 is a cross-sectional view illustrating a configuration of a semiconductor substrate 101 according to the embodiment 1 of the present invention. The semiconductor substrate 101 includes a free-standing substrate 201, a lamination buffer layer 201, a nitride semiconductor layer 203, an amorphous semiconductor layer 205, a high-roughness layer 206, and a diamond layer 207.

The free-standing substrate 201 is a substrate of Si, SiC, or GaN, for example. The lamination buffer layer 202 which is provided to grow the nitride semiconductor layer 203 while reducing a defect has a lamination structure of polycrystalline nitride semiconductor layers of AlGaN and MN, for example. The single-crystalline nitride semiconductor layer 203 is formed on the lamination buffer layer 202.

The amorphous semiconductor layer 205, the high-roughness layer 206, and the diamond layer 207 are sequentially laminated on a back surface side (a lower side of a sheet of FIG. 1) of the free-standing substrate 201. An opening portion 204 from which the lamination buffer layer 202 is exposed is provided in the free-standing substrate 201 and the amorphous semiconductor layer 205 is provided to be in contact with the lamination buffer layer 202 in the opening portion 204. The diamond layer 207 functions as a heat radiation film.

A feature point of the semiconductor substrate 101 is that the amorphous semiconductor layer 205 and the high-roughness layer 206 are located between the nitride semiconductor layer 203 and the diamond layer 207. The high-roughness layer 206 has roughness (surface roughness) larger than the amorphous semiconductor layer 205, and is provided to increase adhesion to the diamond layer 207. The amorphous semiconductor layer 205 which is an intrinsic amorphous semiconductor layer is provided to prevent damage to the nitride semiconductor layer 203 at a time of forming the high-roughness layer 206.

That is to say, the semiconductor substrate 101 according to the embodiment 1 includes the nitride semiconductor layer 203, the amorphous semiconductor layer 205 formed on one main surface side of the nitride semiconductor layer 203, the high-roughness layer 206 which is the semiconductor layer formed on the amorphous semiconductor layer 205 and has the surface roughness larger than the amorphous semiconductor layer 205, and the diamond layer 207 formed on the high-roughness layer 206.

<A-2. Manufacturing Method>

FIGS. 2, 3, 4, and 5 are cross-sectional views each illustrating a method of manufacturing the semiconductor substrate 101. The method of manufacturing the semiconductor substrate 101 is described hereinafter along with these drawings.

Figure 2:
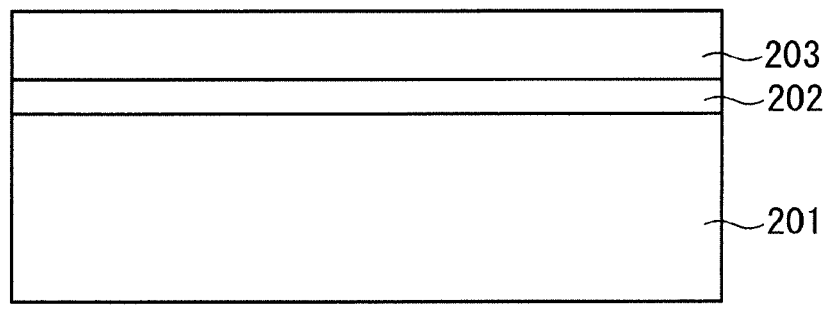
FIG. 2 A cross-sectional view illustrating a process of manufacturing the semiconductor substrate according to the embodiment 1.

Firstly, as illustrated in FIG. 2, the lamination buffer layer 202 is formed on the free-standing substrate 201, and the single-crystalline nitride semiconductor layer 203 is formed on the lamination buffer layer 202.

Figure 3:
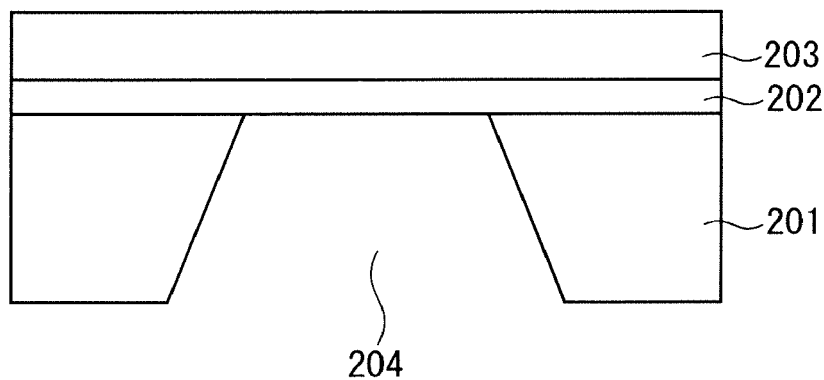
FIG. 3 A cross-sectional view illustrating a process of manufacturing the semiconductor substrate according to the embodiment 1.

Next, as illustrated in FIG. 3, the opening portion 204 is formed in the free-standing substrate 201 to expose the lamination buffer layer 202 from the opening portion 204. Although reactive ion etching (RIE) is adopted to form the opening portion 204 in the present embodiment, the other physical etching processing or a chemical etching processing may also be adopted.

Figure 4:
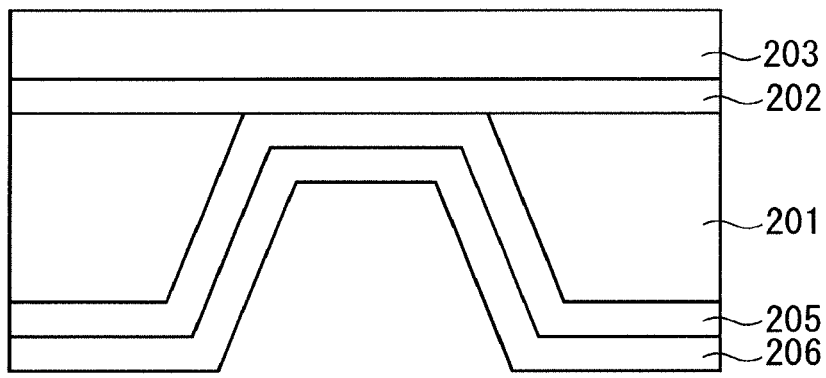
FIG. 4 A cross-sectional view illustrating a process of manufacturing the semiconductor substrate according to the embodiment 1.

Subsequently, as illustrated in FIG. 4, amorphous silicon is laminated as the amorphous semiconductor layer 205 on the free-standing substrate 201 and the lamination buffer layer 202 in the opening portion 204. In the present embodiment, the amorphous semiconductor layer 205 is formed using plasma CVD method, however, the other deposition method, for example, thermal CVD or optical CVD which is generally adopted may also be adopted.

Subsequently, microcrystalline silicon is laminated as the high-roughness layer 206 on the amorphous semiconductor layer 205.

In the present embodiment, the amorphous silicon is used as the amorphous semiconductor layer 205, and the microcrystalline silicon is used as the high-roughness layer 206, thus the amorphous semiconductor layer 205 and the high-roughness layer 206 can be generated by the same material gas and device. In the present embodiment, for example, $SiH_4$ and $H_2$ are used as the material gas, and the amorphous silicon is formed with a gas flow ratio of 1:15, and the microcrystalline silicon is formed with a gas flow ratio of 1:200. The microcrystalline silicon is formed under a condition of a high hydrogen dilution ratio in this manner, a surface thereof is largely roughened by hydrogen radical. A layer having an arithmetic average roughness Ra value of approximately several nm is thereby formed.

Although the formation of the microcrystal can be confirmed using Raman spectrometric method, the high-roughness layer 206 preferably has the high surface roughness in the present invention, thus any of microcrystal and amorphia is applicable from a viewpoint thereof. Actually, a film which does not have a Raman spectral peak but is substantially amorphous may be adopted as the high-roughness layer 206. However, it is advantageous to use the microcrystalline silicon by reason that the microcrystalline silicon contains hydrogen in the film, thus is hardly etched.

Specifically, the surface roughness of the high-roughness layer 206 preferably has the Ra value ranging from 1 nm to 50 nm. Since diamond grows from a scratch (asperity) having a size of nanodiamond particle with diameter of several nm or a size corresponding thereto, an initial nucleus of diamond sufficiently penetrates into a concave portion of the high-roughness layer 206 by setting the Ra value of the high-roughness layer 206 within the range described above. The Ra value of the microcrystalline silicon (the high-roughness layer 206) manufactured this time is confirmed to be approximately 5 nm by an evaluation using an atomic force microscope.

In the present embodiment, the amorphous silicon is used as the material of the amorphous semiconductor layer 205 and the microcrystalline silicon is used as the material of the high-roughness layer 206, however, the other material gas may be injected at the time of the film formation to use a silicon series compound such as silicon oxide, silicon nitride, or silicon carbide.

When the nitride semiconductor layer 203 is the GaN layer, a thermal expansion coefficient of GaN is 5.6 ppm/K.

In the meanwhile, a thermal expansion coefficient of diamond is 1.1 ppm/K, that is largely different from that of GaN. Since a temperature in the growth of diamond reaches 1000° C., high heat stress is applied between the diamond layer 207 and the GaN layer (the nitride semiconductor layer), and may be one of causes of deterioration in adhesion between these layers. Each of the thermal expansion coefficients of the amorphous silicon and the microcrystalline silicon is 3 ppm/K. Accordingly, when the amorphous silicon layer is adopted to the amorphous semiconductor layer 205 and the microcrystalline silicon layer is adopted to the high-roughness layer 206, each of the thermal expansion coefficients of the amorphous semiconductor layer 205 and the high-roughness layer 206 takes a value intermediate between the thermal expansion coefficients of the nitride semiconductor layer 203 and the diamond layer 207. Accordingly, in addition to the increase in the adhesion to the diamond layer 207 by the high roughness of the high-roughness layer 206, the adhesion to the diamond layer 207 can also be increased by making the amorphous semiconductor layer 205 and the high-roughness layer 206 function as the layers for reducing a distortion caused by a difference between the thermal expansion coefficients.

Silicon oxide may be used as the amorphous semiconductor layer 205. Since oxide silicon has the thermal expansion coefficient close to diamond, an occurrence of stress caused by the difference between the thermal expansion coefficients of the amorphous semiconductor layer 205 and diamond can be further reduced under room temperature environment. In the process of manufacturing the semiconductor substrate, the temperature is raised after forming the amorphous semiconductor layer 205 on the nitride semiconductor layer 203, thereby forming the diamond layer 207. Since oxide silicon has the thermal expansion coefficient close to diamond, the distortion due to the thermal expansion in a cooling process after forming the diamond layer 207 can be improved. Toughness of the free-standing substrate 201 increases as the temperature increases, and a risk of damage to the substrate caused by the deformation of the substrate is reduced, thus it is also efficient to adopt a structure which prevents the stress caused by the difference between the thermal expansion coefficients when the temperature is low. Quartz, for example, may also be used in this point, although a thermal expansion coefficient thereof falls below diamond (1.1 ppm/K).

Figure 5:
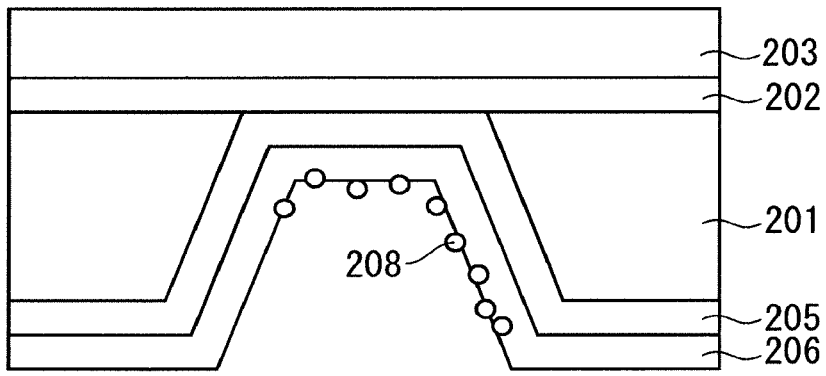
FIG. 5 A cross-sectional view illustrating a process of manufacturing the semiconductor substrate according to the embodiment 1.

After the formation of the high-roughness layer 206, the scratching processing is performed on the high-roughness layer 206 using diamond microparticles 208 as illustrated in FIG. 5, and the diamond microparticles 208 are dispersed on the surface of the high-roughness layer 206. These diamond microparticles 208 become growth nuclei (initial nuclei) of diamond. The scratching processing is performed by an ultrasonic processing in an aqueous solution of the diamond microparticles 208. In the present embodiment, an aqueous solution containing 0.01 wt. % diamond microparticles 208 each having a diameter of 5 to 10 nm is manufactured, and the substrate to be processed is put therein to perform the ultrasonic processing for thirty minutes at a power of 1 W/cm2. Subsequently, as a result of observing a SEM image of the surface of the high-roughness layer 206, the diamond microparticles 208 adhering thereto is confirmed.

The diamond microparticle 208 having a particle diameter of 10 μm at a maximum may be used for the scratching processing as well as a nanoparticle. However, when the diamond microparticles 208 each having the particle diameter of 5 to 20 nm are used, the diamond layer 207 can be grown using the diamond microparticles 208 adhering through the scratching processing as the initial nucleus, thus there is no need to perform the processing of attaching the diamond microparticles 208 to the surface of the high-roughness layer 206 separately from the scratching processing.

Since the effect similar to that of the scratching processing can be obtained by providing the high-roughness layer 206, the scratching processing by the diamond microparticles may be omitted for reducing the process. However, a density of the initial nucleus of diamond can be increased by performing the scratching processing.

Finally, the diamond layer 207 is formed on the high-roughness layer 206 using microwave plasma CVD method. In the microwave plasma CVD method, high-energy plasma is generated in a vacuum chamber using a power transport by microwave of 2.45 GHz to form the diamond layer 207. CH4, H2, and a small amount of O2 is used as the material gas. In this case, CH4 resolved by heat contributes to the growth of diamond. The other carbon hydride such as C2H2 and C3H8 and CO2 may also be used as the material gas other than those above. In the present embodiment, the gas flow ratio of CH4 to H2 is set to 1:10, and only diamond crystals having high hydrogen etching resistance are selected and grown.

The growth temperature of diamond ranges approximately from 800 to 1100° C., and high-temperature hydrogen radial occurs in forming the diamond layer, so that the surface of the nitride semiconductor layer 203 is damaged by the hydrogen radical in a conventional semiconductor substrate. However, in the semiconductor substrate 101, the amorphous semiconductor layer 205 and the high-roughness layer 206 are formed on the main surface of the nitride semiconductor layer 203 and then, the diamond layer 207 is formed thereon, thus the damage to the nitride semiconductor layer 203 caused by the hydrogen radical can be prevented.

Although the microwave plasma CVD method is adopted to manufacture the diamond layer 207, hot filament CVD method may alternatively be used as a typical manufacturing method. In this method, the material gas is resolved by heating a catalyst wire of tungsten, for example, being put inside the chamber, and radical is supplied to the substrate heated to a high temperature to grow the diamond layer. The temperature of the substrate increases to approximately 1000° C. in the manner similar to the microwave plasma CVD method. This method has a feature that the temperature of the surface of the substrate can be equalized in accordance with an arrangement pattern of the catalyst wire without using plasma, thus a uniform growth can be performed on a larger area. However, in the meanwhile, a film formation velocity is slower than that of the microwave plasma CVD method. The catalyst wire is heated to approximately 2200° C., so that there is also a problem that a material of the catalyst wire is taken into the film as an impurity.

In this manner, the semiconductor substrate 101 illustrated in FIG. 1 with the diamond layer 207 on the back surface side of the nitride semiconductor layer 203 is completed. In the semiconductor substrate 101, a device structure can be manufactured on the surface of the nitride semiconductor layer 203, and a surface of the diamond layer 207 is ground to be connected to the other substrate.

B. Embodiment 2

<B-1. Configuration>
In the description of the embodiment 1, the amorphous silicon is used for the amorphous semiconductor layer 205.

However, in a case where GaN is used for forming the nitride semiconductor layer 203 and the lamination buffer layer 202, there is a problem that when the temperature of the substrate increases to approximately 1000° C. at the time of forming the diamond layer 207, GaN constituting the nitride semiconductor layer 203 or the lamination buffer layer 202 is reacted with the silicon atom of the amorphous semiconductor layer 205 (melt-back etching).

Although the contact between silicon and GaN can be prevented by using an aluminum nitride (AlN) layer for the lamination buffer layer 202, in the present embodiment, the problem described above is solved by using diamond-like carbon (DLC) for the amorphous semiconductor layer 205.

Figure 6:
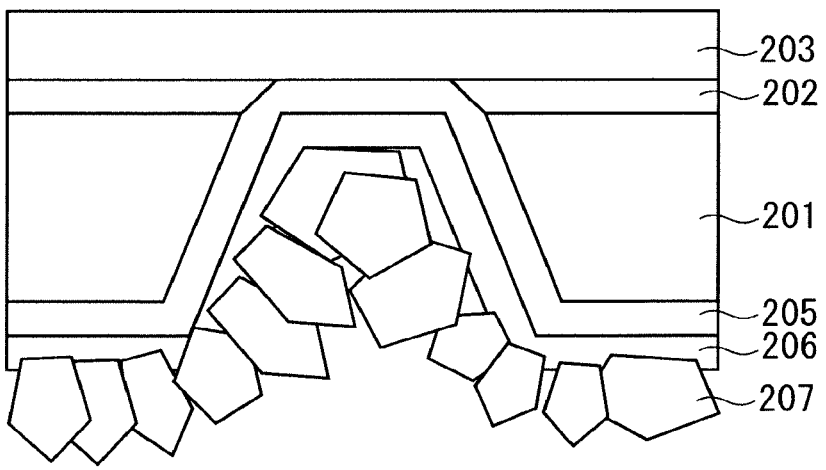
FIG. 6 A cross-sectional view of a semiconductor substrate according to an embodiment 2.

FIG. 6 is a cross-sectional view of a semiconductor substrate 102 according to the embodiment 2. In the semiconductor substrate 102, the amorphous semiconductor layer 205 is made of DLC. There is no lamination buffer layer 202 in the opening portion 204 in the free-standing substrate 201, and the amorphous semiconductor layer 205 is formed to be in contact with the nitride semiconductor layer 203. The configuration of the semiconductor substrate 102 other than that above is similar to that of the semiconductor substrate 101 in the embodiment 1.

According to the semiconductor substrate 102, the amorphous semiconductor layer 205 is made of DLC, thus the problem of the melt-back etching that the silicon atom and the gallium atom are reacted between the amorphous semiconductor layer 205 and the nitride semiconductor layer 203 is solved. Even in a case where the high-roughness layer 206 contains the silicon atom, DLC functions as a barrier when the silicon atom is diffused to the nitride semiconductor layer 203, thus the melt-back etching caused by the silicon atom can also be prevented. Suppressed accordingly are a partial non-formation of the diamond layer 207 (loss of diamond), a partial non-formation of the amorphous semiconductor layer 205 and the high-roughness layer 206, and a defect in the nitride semiconductor layer 203.

<B-2. Manufacturing Method>

Figure 7:
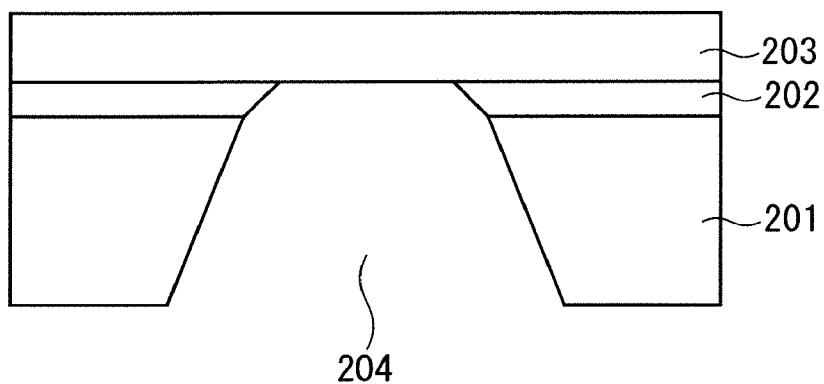
FIG. 7 A cross-sectional view illustrating a process of manufacturing the semiconductor substrate according to the embodiment 2.
Figure 8:
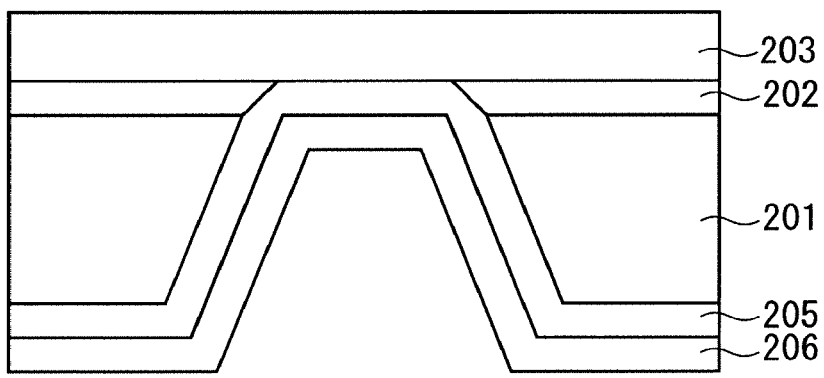
FIG. 8 A cross-sectional view illustrating a process of manufacturing the semiconductor substrate according to the embodiment 2.

FIGS. 7 and 8 are cross-sectional views each illustrating a method of manufacturing the semiconductor substrate 102. The method of manufacturing the semiconductor substrate 102 is described hereinafter along with FIGS. 7 and 8.

Firstly, as illustrated in FIG. 2, in the manner similar to the embodiment 1, the lamination buffer layer 202 is formed on the free-standing substrate 201 of Si, SiC, or GaN, for example, and the single-crystalline nitride semiconductor layer 203 is formed on the lamination buffer layer 202.

Next, as illustrated in FIG. 7, the free-standing substrate 201 is etched to form the opening portion 204. At this time, not only the free-standing substrate 201 but also the lamination buffer layer 202 are etched to expose the nitride semiconductor layer 203 from the opening portion 204. In the present embodiment, the opening portion 204 is formed using the reactive ion etching, however, the opening portion 204 may also be formed by the other physical etching processing or a chemical etching processing.

In the present embodiment, the amorphous semiconductor layer 205 made of DLC prevents the diffusion and penetration of the silicon atom to the nitride semiconductor layer 203, thus there is no need to leave the lamination buffer layer 202 in the opening portion 204. Heat conductivity between the nitride semiconductor layer 203 and the diamond layer 207 can be increased by removing the lamination buffer layer 202 in the opening portion 204.

Subsequently, DLC is formed on the free-standing substrate 201 and the nitride semiconductor layer 203 in the opening portion 204 as the amorphous semiconductor layer 205, using sputtering method.

Although DLC can also be manufactured using the plasma CVD method or the thermal CVD method, DLC having a low content of hydrogen can be easily manufactured by the sputtering method, thus it is preferable to adopt the sputtering method to increase airtightness of DLC.

Subsequently, as illustrated in FIG. 8, microcrystalline silicon which is to be the high-roughness layer 206 is formed on the amorphous semiconductor layer 205 by the plasma CVD method in the manner similar to the embodiment 1. Subsequently, the scratching processing is performed on the surface of the high-roughness layer 206 using the diamond microparticles, and the diamond layer 207 is formed using the microwave plasma CVD method.

C. Embodiment 3

<C-1. Configuration>

In a semiconductor substrate of the embodiment 3, the amorphous semiconductor layer 205 is made of DLC in the manner similar to the embodiment 2, and the high-roughness layer 206 is made up of a micro-crystalline diamond layer. The semiconductor substrate of the embodiment 3 is similar to the semiconductor substrate 102 of the embodiment 2 other than the material of the high-roughness layer 206.

<C-2. Manufacturing Method>

In the embodiment 2, it is preferable to make DLC which is the amorphous semiconductor layer 205 with high airtightness so that the silicon atom contained in the high-roughness layer 206 is not diffused to the nitride semiconductor layer 203, thus it is preferable to form the amorphous semiconductor layer 205 using the sputtering method.

However, in the semiconductor substrate of the embodiment 3, the amorphous semiconductor layer 205 is made up of the DLC layer and the high-roughness layer 206 is made up of the microcrystalline diamond layer, thus both layers have a structure made up of the carbon layer and do not contain the silicon element. Accordingly, there is no concern about the melt-back etching between the amorphous semiconductor layer 205 and the nitride semiconductor layer 203 and the high-roughness layer 206 and the nitride semiconductor layer 203.

Thus, the DLC layer having a large content of hydrogen and low airtightness may be formed as the amorphous semiconductor layer 205 using the plasma CVD method. In this case, the semiconductor substrate in which the opening portion 204 illustrated in FIG. 7 is formed is put in a plasma CVD device to form the DLC layer as the amorphous semiconductor layer 205 on the free-standing substrate 201 and the nitride semiconductor layer 203 in the opening portion 204. The material gas is CH4 and H2. The temperature is set equal to or lower than 700° C., which is lower than that of a condition of forming a diamond film, to form the DLC layer.

Next, when the CH4 gas is removed and the processing is performed only with H2 gas plasma, a surface of the DLC layer is micro-crystallized and the roughness occurs by an influence of the hydrogen radical, thus microcrystalline diamond is formed as the high-roughness layer 206. In this manner, the amorphous semiconductor layer 205 and the high-roughness layer 206 can be sequentially formed by the plasma CVD method.

The microcrystalline diamond has a crystal structure of diamond in a carbon film, and a crystal peak caused by diamond can be detected by XRD method. In the present embodiment, as described in the embodiment 1, the roughness of the surface needs to have the Ra value ranging from 1 to 50 nm, and the content of hydrogen is preferably equal to or smaller than 5%.

After forming the high-roughness layer 206, the scratching processing is performed by the diamond microparticles 208 to form the diamond layer 207 in the manner similar to the embodiments 1 and 2.

Alternatively, the diamond layer 207 may be directly formed by the microwave plasma CVD method without the scratching processing. In this case, the diamond layer 207 is formed using CH4 and H2 under the condition of 1000° C. According to the above manufacturing method, the amorphous semiconductor layer 205, the high-roughness layer 206, and the diamond layer 207 are sequentially formed while generating plasma. Thus, an oxide layer or a void is prevented from being generated in each interface, and heat conductivity can be further increased.

D. Embodiment 4

<D-1. Configuration>

A semiconductor substrate of the embodiment 4 has a feature that the amorphous semiconductor layer 205 is made of aluminum nitride (AlN). The microcrystalline silicon is used for forming the high-roughness layer 206 in the manner similar to the embodiments 1 and 2. The semiconductor substrate of the embodiment 4 is similar to the semiconductor substrate 102 of the embodiment 2 other than the material of the amorphous semiconductor layer 205.

Since AlN is used as a base for forming the nitride semiconductor layer 203 in some cases, the lamination buffer layer 202 may contain a single-crystalline AlN, however, the lamination buffer layer 202 containing AlN generally has a thickness of approximately 1 μm, thus may inhibit the heat conductivity. In the semiconductor substrate described in the present embodiment, after the lamination buffer layer 202 is removed as described in the embodiment 2, AlN is newly formed as the amorphous semiconductor layer 205. At this time, a heat propagation is mainly controlled in the diamond layer, thus a heat resistance of the amorphous semiconductor layer 205 is preferably equal to or smaller than 10% of that of the diamond layer. The heat conductivity of AlN is 150 W/mK and the heat conductivity of the polycrystalline diamond is 1500 W/mK, thus when a film thickness of the polycrystalline diamond is equal to or larger than 10 μm, a thickness of the amorphous semiconductor layer 205 is preferably equal to or smaller than 100 nm.

The amorphous semiconductor layer 205 has a role of increasing the adhesion to the free-standing substrate 201 and also has a role of reducing a plasma damage in forming the high-roughness layer 206 and the diamond layer 207. When the diamond layer 207 is formed, the temperature of the substrate is increased to approximately 1000° C., so that a material which can be used is limited from a viewpoint of protecting the substrate.

The embodiment 2 describes the case of applying DLC as the amorphous semiconductor layer 205, however, in the DLC layer, the etching rapidly proceeds under the condition where O2 is contained at the time of forming the film at a high temperature, so that there is a possibility that unevenness occurs in the generation of the nucleus of diamond depending on the condition. Since AlN is used in the present embodiment, the etching speed in the amorphous semiconductor layer 205 can be sufficiently reduced even at a high temperature exceeding 1000° C. under an atmosphere containing O2, thus the function of the amorphous semiconductor layer 205 described above can be maintained. The increase in the temperature of forming the film and the condition of containing O2 are effective methods to form the film of diamond at high speed and increase crystalline nature, and those conditions can be used by using the amorphous semiconductor layer 205 according to the present embodiment, the diamond film having the increased crystalline nature can be manufactured at high speed.

<D-2. Manufacturing Method>

In the semiconductor substrate described in the embodiment 4, the manufacturing method similar to that of the semiconductor substrate of the embodiment 2 is adopted. However, AlN is used as the amorphous semiconductor layer 205 in the embodiment 4, thus the method in which only the method of manufacturing the amorphous semiconductor layer is different is adopted. That is to say, the lamination buffer layer 202 and the single-crystalline nitride semiconductor layer 203 are formed on the free-standing substrate 201 as illustrated in FIG. 2, and subsequently, the etching processing is performed on the free-standing substrate 201 and the lamination buffer layer 202 to form the opening portion 204.

Subsequently, the amorphous semiconductor layer 205 made of AlN is formed by the sputtering method. After the amorphous semiconductor layer 205 is formed, the high-roughness layer 206 made of the microcrystalline silicon is formed on the amorphous semiconductor layer 205 made of AlN by the plasma CVD method in the manner similar to the case of the embodiments 1 and 2. Finally, the diamond layer 207 is formed by the microwave plasma CVD method. Accordingly, the semiconductor substrate described in the embodiment 4 can be manufactured effectively.

According to the present invention, each embodiment can be arbitrarily combined, or each embodiment can be appropriately varied or omitted within the scope of the invention. The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 101, 102 semiconductor substrate, 201 free-standing substrate, 202 lamination buffer layer, 203 nitride semiconductor layer, 204 opening portion, 205 amorphous semiconductor layer, 206 high-roughness layer, 207 diamond layer, 208 diamond microparticle.

The invention claimed is:

1. A semiconductor substrate, comprising:
a nitride semiconductor layer;
an amorphous semiconductor layer being formed on one main surface side of the nitride semiconductor layer;
a high-roughness layer being formed on the amorphous semiconductor layer and having a surface roughness larger than the amorphous semiconductor layer, wherein the high-roughness layer is a microcrystalline diamond layer, or a microcrystalline silicon layer; and
a diamond layer being formed on the high-roughness layer.

2. The semiconductor substrate according to claim 1, wherein the high-roughness layer has an arithmetic average roughness Ra of 1 nm to 50 nm.

3. The semiconductor substrate according to claim 1, wherein the high-roughness layer is a microcrystalline silicon layer.

4. The semiconductor substrate according to claim 3, wherein the amorphous semiconductor layer is an amorphous silicon layer.

5. The semiconductor substrate according to claim 1, wherein the amorphous semiconductor layer is a DLC layer.

6. The semiconductor substrate according to claim 5, wherein the high-roughness layer is a microcrystalline diamond layer.

7. The semiconductor substrate according to claim 1, wherein the amorphous semiconductor layer is an oxide silicon layer.

8. The semiconductor substrate according to claim 1, wherein the amorphous semiconductor layer is a nitride aluminum layer.

9. The semiconductor substrate according to claim 2, wherein the high-roughness layer is a microcrystalline silicon layer.

10. The semiconductor substrate according to claim 9, wherein the amorphous semiconductor layer is an amorphous silicon layer.

11. The semiconductor substrate according to claim 2, wherein the amorphous semiconductor layer is a DLC layer.

12. The semiconductor substrate according to claim 3, wherein the amorphous semiconductor layer is a DLC layer.

13. The semiconductor substrate according to claim 9, wherein the amorphous semiconductor layer is a DLC layer.

14. The semiconductor substrate according to claim 11, wherein the high-roughness layer is a microcrystalline diamond layer.

15. The semiconductor substrate according to claim 12, wherein the high-roughness layer is a microcrystalline diamond layer.

16. The semiconductor substrate according to claim 13, wherein the high-roughness layer is a microcrystalline diamond layer.

* * * * *